(12) United States Patent
Stanton

(10) Patent No.: US 7,305,333 B2
(45) Date of Patent: *Dec. 4, 2007

(54) PROJECTION ELECTRON BEAM LITHOGRAPHY APPARATUS AND METHOD EMPLOYING AN ESTIMATOR

(75) Inventor: Stuart T. Stanton, Bridgewater, NJ (US)

(73) Assignee: Agere Systems Inc., Allentown, PA (US)

( * ) Notice: Subject to any disclaimer, the term of this patent is extended or adjusted under 35 U.S.C. 154(b) by 142 days.

This patent is subject to a terminal disclaimer.

(21) Appl. No.: 11/328,876

(22) Filed: Jan. 10, 2006

(65) Prior Publication Data

US 2006/0116858 A1    Jun. 1, 2006

Related U.S. Application Data

(63) Continuation of application No. 09/940,512, filed on Aug. 29, 2001, now Pat. No. 7,050,957.

(60) Provisional application No. 60/270,872, filed on Feb. 26, 2001.

(51) Int. Cl.
*G06F 17/50* (2006.01)

(52) U.S. Cl. .................. 703/13; 430/30; 700/30; 703/2; 703/14

(58) Field of Classification Search ............ 703/2, 703/13, 14; 700/30; 708/300, 313; 430/30
See application file for complete search history.

(56) References Cited

U.S. PATENT DOCUMENTS

| | | |
|---|---|---|
| 5,719,796 A | 2/1998 | Chen |
| 6,177,218 B1 | 1/2001 | Felker et al. |
| 6,243,158 B1 | 6/2001 | Shiraishi |
| 6,285,971 B1 | 9/2001 | Shah et al. |
| 6,631,299 B1 | 10/2003 | Patel et al. |
| 6,748,280 B1 * | 6/2004 | Zou et al. .................. 700/31 |
| 6,925,478 B2 | 8/2005 | Jabbari et al. |
| 7,050,957 B2 | 5/2006 | Stanton |

OTHER PUBLICATIONS

Palmer et al., "Control of Photoresist Properties: A Kalman Filter Based Approach", IEEE Transactions on Semiconductor Manufacturing, vol. 9, Issue 2, May 1996, pp. 208-214.*

Stanton et al., "Initial Wafer Heating Analysis for a SCALPEL Lithography System", Microelectronic Engineering, vol. 46, Issues 1-4, May 1999, pp. 235-238.

* cited by examiner

*Primary Examiner*—Kamini Shah
*Assistant Examiner*—Herng-der Day

(57) ABSTRACT

A process and method for projection beam lithography which utilizes an estimator, such as a Kalman filter to control electron beam placement. The Kalman filter receives predictive information from a model and measurement information from a projection electron beam lithography tool and compensates for factors which cause beam placement error such as wafer heating and beam drift. The process and method may also utilize an adaptive Kalman filter to control electron beam placement. The adaptive Kalman filter receives predictive information from a number of models and measurement information from a projection electron beam lithography tool and compensates for factors which cause beam placement error such as heating and beam drift. The Kalman filter may be implemented such that real-time process control may be achieved.

18 Claims, 4 Drawing Sheets

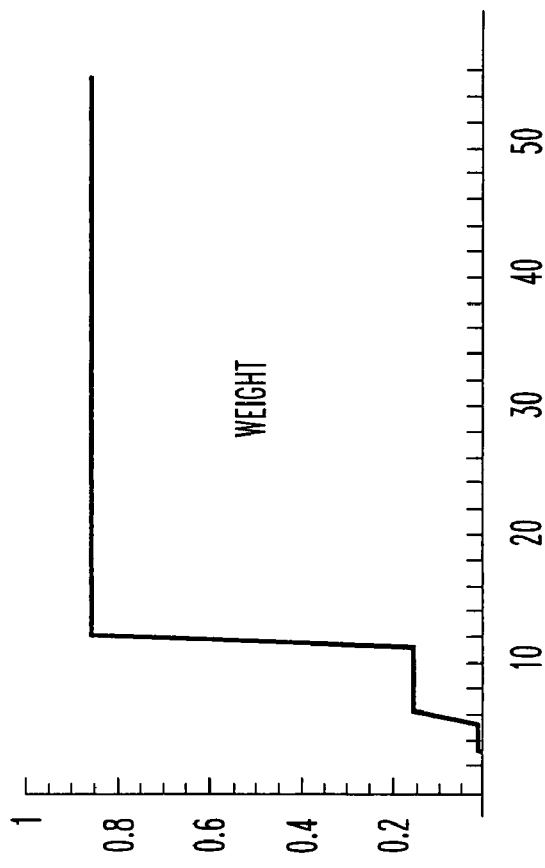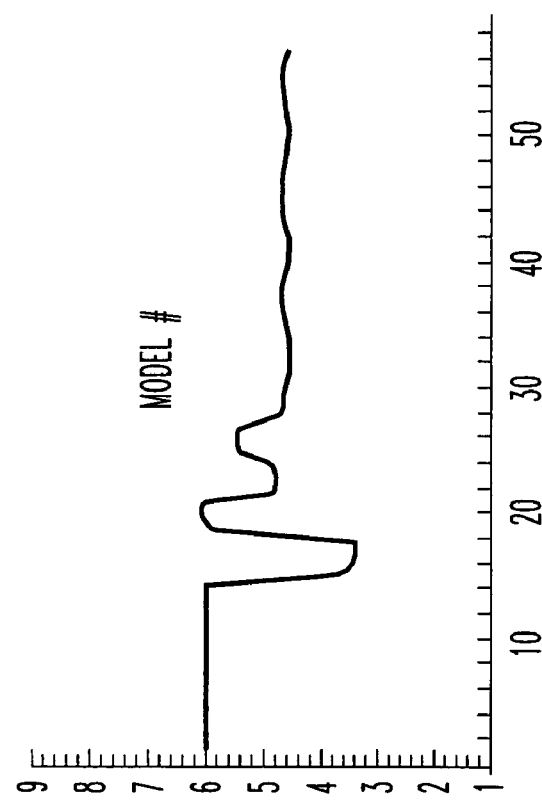
FIG. 5A
FIG. 5B

PROJECTION ELECTRON BEAM LITHOGRAPHY APPARATUS AND METHOD EMPLOYING AN ESTIMATOR

CROSS REFERENCE TO RELATED APPLICATIONS

This application is a continuation of U.S. patent application Ser. No. 09/940,512 entitled "PROJECTION ELECTRON BEAM LITHOGRAPHY APPARATUS AND METHOD EMPLOYING AN ESTIMATOR" which was filed on Aug. 29, 2001, and issued on May 23, 2006, as U.S. Pat. No. 7,050,957 to Stuart T. Stanton. U.S. Pat. No. 7,050,957 claims the benefit of U.S. Provisional Patent Application No. 60/270,872, entitled "PROJECTION ELECTRON BEAM LITHOGRAPHY APPARATUS AND METHOD EMPLOYING A KALMAN FILTER" filed on Feb. 26, 2001, by Stuart T. Stanton. The above-listed applications are commonly assigned with the present invention and are incorporated herein by reference as if reproduced herein in its entirety.

TECHNICAL FIELD OF THE INVENTION

This invention relates to the field of projection electron beam lithography and in particular, to projection electron beam lithography employing an estimator.

BACKGROUND OF THE INVENTION

In projection electron beam lithography, precise control of the placement of the electron beam is required in order to ensure that the image is constructed without distortion and aligned to a prior process level. Precise control of the electron beam placement is difficult because electron beam placement depends on many factors.

One of these factors is a wafer distortion response to the heating action of a projection electron beam lithography beam, ranging up to many hundreds of nanometers, depending on conditions. Correction schemes include a model-based predictor for sub-field center placement adjustment. The algorithm implemented by the model-based predictor controls the writing of a matched dynamic distortion with an accuracy of about 1% or better for the largest, long-length-scale effects of approximately 500 nm.

Other factors in addition to a predictable heating response, such as beam drift and wafer-to-chuck contact variation, also affect placement accuracy. Their effect may be either random or very difficult to correctly model.

As stated above, wafer-to-chuck contact may have an effect on the response that requires enhancement to a basic predictive model. Modeling and experiments have both demonstrated the desirable result that good thermal contact to the chuck (~150 W/m$^2$K) can lower the accumulated size of the wafer-heating response by a factor of roughly 10, thus enlarging the fractional correction error tolerance similarly. However, there are several factors, such as wafer-flatness, particle tolerance, frictional contact, and pulling-force that may remain variable or random despite efforts in chuck design. Realistically, the chuck design process can only reduce frictional influences on the heating response to a form of chuck-coordinate-system drift that is slow and indistinguishable from beam drift. Since important parameters in the predictive model may be variable from wafer to wafer, prediction alone is not sufficient for full correction of beam placement.

Further, it is difficult to perform the complex model computation required to determine correct beam placement in a short period of time.

The only alternative to prediction is measurement. The obvious primary measurement of beam placement involves an alignment mark sensing process. The use of a re-alignment strategy, or some variation of local alignment, is a common approach to dealing with drift in many other electron beam lithography applications, such as mask-making and direct-writing. This often involves time-consuming actions like extra stage motions that detract from throughput, but this can be a tolerable situation when making relatively few high-value exposures.

In the area of production wafer-level lithography using SCALPEL, throughput is a concern even without the use of local alignment or complex re-alignment strategies. Hence, re-alignment is not a suitable correction strategy for a high-throughput SCALPEL tool.

Based on the above, it is clear that an enhancement to the predictive models used for beam placement correction is desirable, making use of alignment mark sensing and efficient computation.

SUMMARY OF THE INVENTION

To address the above-discussed deficiencies of the prior art, the present invention provides an estimator that integrates a predictive model and a measurement capability, both subject to substantial noise sources, plus measurement sampling limitations. The estimator works in real time with only historical data. In one exemplary embodiment, the estimator is a Kalman filter, which may be a least-squares based optimum estimation algorithm for the states of time-dependent systems, using linear matrix algebra.

In the present invention, the Kalman filter is used to correct for wafer heating, beam drift and/or other errors in a projection electron beam lithography system, such as for example, SCALPEL. By using a Kalman filter, real time process control is obtained using a greater amount of information than could be used if conventional modeling/process control and measurement techniques were used.

The method and apparatus of the present invention may also employ an adaptive Kalman filter (A-KF) correction for wafer heating, beam drift and/or other errors. The adaptive Kalman filter correction may be based on a numerical response-model interface that allows efficient integration of relatively slow but infrequent pre-calculation results, and allows real-time adaptive Kalman filter functionality.

An adaptive Kalman filter is particularly effective when a model parameter uncertainty problem is superimposed on a more elementary state noise problem. The two types of unknown system response can both be handled using only one measurement data sequence, but are distinguishable in terms of their statistical behavior. In SCALPEL, an example of an uncertain parameter is wafer-to-chuck thermal contact, which should be a nearly-fixed quantity on length scales of interest, during each wafer exposure. The effect of wafer-to-chuck thermal contact on the response of the system is momentarily stable and non-random for any one execution of the Kalman filter, even if poorly known. This is in contrast to the lumped beam drift and frictional chuck-coordinate-system drifts that may be more like a random-walk effect, and hence most readily treated as a band-limited state noise.

In a preferred embodiment, the control algorithm which performs the predictive model can be partitioned into global (wafer scale) and local (die scale) components. A pure-predictor would suffice for the local problem since the main noise and uncertainty terms do not act on this scale and the errors are inherently smaller. The use of an adaptive Kalman filter only for the global part of the problem would be very efficient.

The method and apparatus of the present invention may also employ a multi-model adaptation corrector, which provides a best estimate that converges on the correct unknown model parameter choice.

The behavior of the Kalman filter is very good for scenarios that are realistic or somewhat pessimistic in key parameters pertaining to SCALPEL operation, including a slow beam drift of typically 40 nm and a 15 nm 3-sigma one-site alignment noise. Adaptation in a multi-model form is effective at handling the problem of at least a factor of two thermal contact parameter uncertainty.

Combined errors on the order of 50 nm in predicting responses that are well over 100 nm can be reduced to 10 nm or better, in a case of low contact and thermal dissipation to the chuck. With some optimization and the benefit of maximum chuck thermal contact, error budget requirements of nominally 5 nm can also be met.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIGS. 5a and 5b illustrate graphs that represent a response of an embodiment of a nominally tuned adaptation scheme based on residual curves and multi-model execution carried out according to the principles of the present invention.

DETAILED DESCRIPTION

Figure 1:
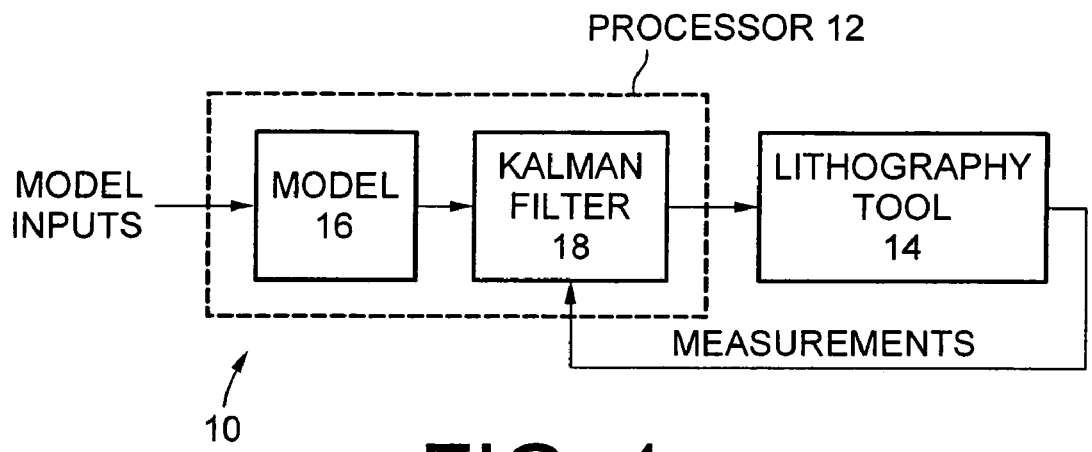
FIG. 1 illustrates a block diagram of an embodiment of a projection electron beam lithography system constructed according to the principles of the present invention.

FIG. 1 illustrates a projection electron beam lithography system 10 in one exemplary embodiment of the present invention. As illustrated, the system 10 includes a processor 12 (either with or without external memory) and a projection electron beam lithography tool 14. In a preferred embodiment, the projection electron beam lithography tool 14 is a SCALPEL tool. A predictive model 16 and a Kalman filter 18 are both implemented in processor 12. The Kalman filter 18 receives predictions from the predictive model 16 and measurements from the projection electron beam lithography tool 14 and controls placement of an electron beam output from the projection electron beam lithography tool 14 as described in more detail below.

A Kalman filter 18 is a recursive algorithm using linear matrix algebra to make an optimal estimate of the state of a system, given a combination of state and measurement noises. The most common form of the optimization is least-squares, which is readily formulated in linear matrix algebra form and is optimum for Gaussian noise, but the algorithm can be more general as well. Nonlinear systems also can be linearized in order to make use of the linear algebra form of the filter.

Figure 2:
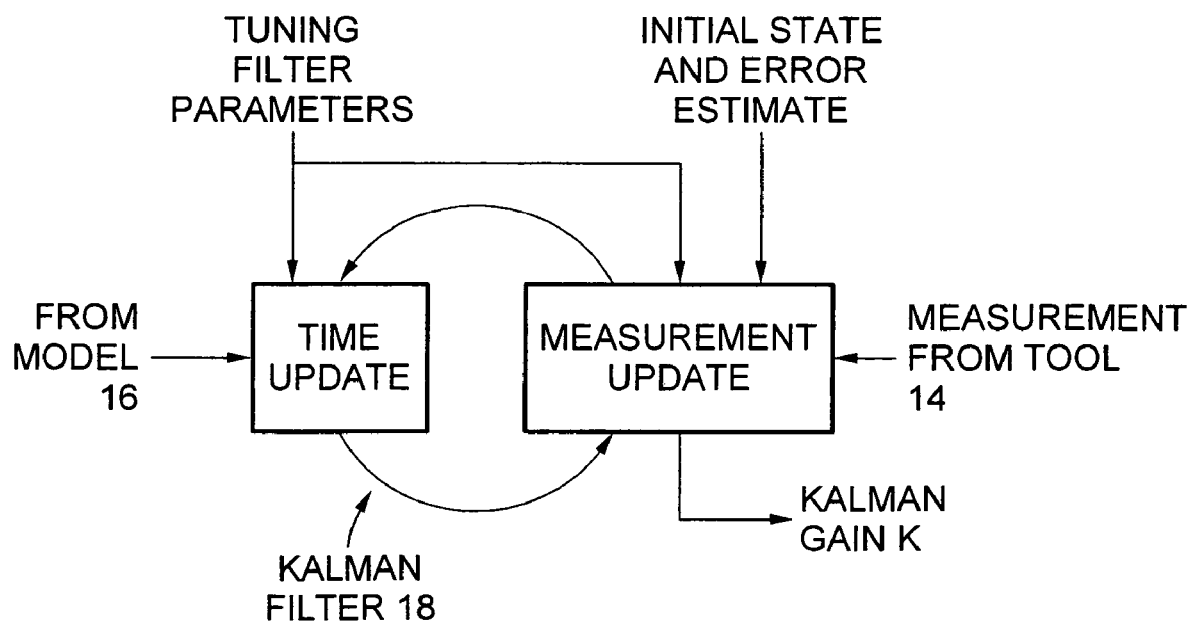
FIG. 2 illustrates a block diagram of an embodiment of the Kalman filter of FIG. 1 constructed according to the principles of the present invention.

The essence of the Kalman filter 18 is to use one or more models 16 to describe the statistical behavior of both the measurement noise and the physical system state noise, so that this information can be used to determine the weighting in the combination of prediction and measurement. This is referred to as "propagating the noise or error covariance", which is an ingredient in one of the two major recursive steps of the filter illustrated by FIG. 2. As illustrated in FIG. 2, predictions from the model 16 and measurements from the tool 14 are recursively processed. By propagating the error covariance, an update of the Kalman gain (K) can be made. This quantity determines the weighting in the filter 18; 0 for pure prediction and 1 for pure measurement. The other major step is propagating the predictive model 16 iteratively based on a starting value from the estimate made in the previous step. This process continues iteratively in a loop. This estimate updating process is not necessarily smooth since the quality of measurement information can change abruptly even if the system state cannot.

"Tuning" the Kalman filter 18 may entail making adjustments in the proposed error/noise statistics model 16 in order to better match "reality". Variants of the Kalman filter 18 allow this to be done adaptively during the course of the filter 18 operation, but it is also common to tune by trial and error as a series of experiments or simulations are performed. In the SCALPEL heating response application, the tuning is motivated by a need to estimate the required sub-field position adjustment for exposures in a sequence, hence reducing the worst error that occurs at any time in the exposure for an ensemble of wafer exposures. Using the Kalman filter 18, prediction alone is good enough in early stages when state errors have not accumulated yet. This is due to the band-limited nature of the beam drift and the action of errors in thermal contact.

A Kalman filter 18 usually uses differential equations of the system state expressed in state-space matrix form. However, the description below uses a common alternative notation, namely "discrete form" notation, which expresses the result at step k+1 caused by propagation forward from step k. This is appropriate for a discrete measurement process, such as the SCALPEL process. Note that the steps modeled are absolutely not limited to those where measurements are made. The Kalman filter 18 naturally deals with this by assigning non-measurement steps with a very large measurement covariance, resulting in the gain (K) being set to zero for those times. So the model 16 can naturally interpolate the state estimate in closely-spaced steps between relatively sparse measurements.

The five basic matrix equations are:

1) State Prediction Update:

$$X(k+1/k)=\Phi(k+1,k)X(k/k)+\Psi(k+1,k)U(k)$$

2) Covariance Prediction Update:

$$P(k+1/k) = \Phi(k+1,k)P(k/k)\Phi^T(k+1,k) + Q^*(k+1)$$

With $Q^*(k+1) = \Gamma(k+1,k)Qd(k)\Phi^T(k+1,k)$

3) Gain Computation:

$$K(k+1) = P(k+1/k)H^T(k+1)[H(k+1)P(k+1/k)H^T(k+1) + R(k+1)]^{-1}$$

4) Estimation Update:

$$X(k+1/k+1) = [I-K(k+1)H(k+1)]X(k+1/k) + K(k+1)Z(k+1)$$

5) Covariance Update:

$$P(k+1/k+1) = [I-K(k+1)H(k+1)]P(k+1/k)$$

These five equations correspond to a state-space representation of the propagation of state X and process of measurement Z, including noise, given by:

$$X(k+1) = \Phi(k+1,k)X(k) + \Gamma(k+1,k)Wd(k) + \Psi(k+1,k)U(k);$$
and $$Z(k+1) = H(k+1)X(k+1) + V(k+1).$$

In all of the above equations, k is a step counter. The use of (n/m), such as (k+1/k), designates "value in step n if given the value in step m." This is distinct from (k+1,k) which designates that the matrix value is sensitive to both the prior and present step count in general. Two examples clarify this notation: X(k+1/k) is the pure prediction update of the state vector X and X(k+1/k+1) is the update of the estimate of state X including measurement.

In the state equations, the values are defined as:
Φ=state propagator model from differential equations which also propagates the state covariance;
U=input term for state, which can be generalized as we will discuss later, except that it does not propagate the state covariance;
Ψ=matrix which translates input to state form;
Wd=state noise in raw form;
Γ=matrix that translates state noise into state form;
V=measurement noise in raw measurement form; and
H=matrix that translates the state into measurement form.
  The other quantities in the filter equations 1)-5) are:
P=state covariance matrix, standard definition with terms in the form $\sigma_i \sigma_j$; has a starting value but is later generated by the filter 18;
Qd=covariance matrix of state noise Wd, in a form like P; nominally an assumed constant, or may be a sequence; generally subject to tuning;
R=covariance matrix for measurement, similar to Qd; usually derived from measurement process modeling or experiments; may be tuned;
K=calculated Kalman gain representing weight of measurement in estimate; and
I=Identity matrix.

Further, $^T$ refers to the transpose operation, and $^{-1}$ refers to matrix inversion.

As indicated by equation 3), K is computed completely from the propagation of measurement covariance and state noise covariance, which includes initial errors and added state noise. These can be done ahead of time in a situation that is not adaptively tuned and when the covariance model is stable.

Similarly, as indicated by equation 4), K acts as a weight on the use of measurement in the estimation update, and a term of the form "I–K" is the converse weight of predictive update.

Equations 1)-5) do not consider time-correlated noise (also known as "non-white" or "colored" noise) in any category. Equations 1)-5) assume that each new time step gives independent new random noise terms.

The entire Kalman filter 18 equation set 1)-5) above can be modified to deal with correlated noises, although there may be a different process for measurement than there is for state. In the case of SCALPEL, measurement by alignment is expected to have no time-correlation in the sense that information at each site has an error with no dependence on prior measurements. However, the state noise of drift clearly cannot be a white noise. Therefore, the state noise may be considered colored and the Kalman filter 18 may be modified accordingly.

The basic form of the equation 1)-5) stays the same except that a few elemental vectors and matrices should be augmented, meaning that new vectors and matrices are composed from old vectors and matrices with terms attached that represent a time-correlation or filter model. One such example is a one-step filter function with variable time constant t0, in the form:

$$\Phi wf = \text{Exp}[-(t_{k+1}-t_k)/t0].$$

One-step colored noise (Wdco) at step k+1 is generated from a new white random noise value (Wdwf) plus a fixed residual amount of the last noise value at k determined by the filter function:

$$Wdco(k+1) = \Phi wf(k+1,k)Wdco(k) + Wdwf(k)$$

Augmentation processes are well-known. Below the equation changes are shown symbolically as extended vectors or groupings of matrices of the same dimensions to form larger matrices, where:

$$X \Rightarrow [X \ Wdco]^T$$

$$H \Rightarrow [H \ 0]$$

$$\Gamma \Rightarrow \text{replaced by } \Gamma aw = [0I]^T$$

The original Γ is integrated with the state propagator:

$$\Phi \Rightarrow \begin{bmatrix} \Phi(\kappa+1,\kappa) & \Gamma(k+1,k) \\ 0 & \Phi wf(k+1,k) \end{bmatrix}$$

$$\Psi \Rightarrow [\Psi \ 0]$$

$$U \Rightarrow [U \ 0]^T$$

Qd ⇒ terms in form $\sigma^2$ become $\sigma^2 [1-\text{Exp}[-2\Delta t/t0]]$
"0" represents a matrix of zeroes.

For the purpose of running Monte-Carlo simulations of the application of a Kalman filter 18 to a specific model, it is typical to only provide a white-noise generator. Either the truth model is propagated in an augmented fashion to obtain filtered noise, or the filter is applied a-priori (as shown here) to a time-series of random elements of the noise matrix. The use of the model 16 can be totally consistent by design, or the effect of an erroneous assumption about the time-correlation can also be simulated.

The Kalman filter 18 described assumes a singular "good" model 16 exists and that physical effects are appropriately modeled as additive random noise. This accurately describes the beam drift effects in SCALPEL. A different problem occurs if the model 16 is not fully known, so an assumed model leads to poorer filter performance than an ideal one would achieve. In general, there are known system model identification procedures that can be used to "learn" what a model should be. Particularly in the absence of state noise, there are many non-Kalman filter approaches to using real-time measurements to converge on the right model and iteratively best-fit a measurement sequence. However, the same limited data may be subject to both noise and parameter uncertainty, as in SCALPEL. For this situation, an adaptive Kalman filter 18 implemented in a multi-model form is a powerful tool.

In general, it is possible for one noise model to actually be the net effect of many more. It is not always obvious which type of disturbance is best treated as a "noise" versus an "uncertain parameter". In all cases, the Kalman filter 18 equations must still have only one linear-additive noise vector in the state. The ability of the Kalman filter 18 to rapidly and efficiently perform real-time estimation depends on the linearity of the matrix formulation. Therefore, a multiplicative noise or a product of two model components having noise must be linearized.

However, if two disturbances are distinguishable because their statistical natures are very different, then one disturbance may be deemed to be a parameter that is momentarily fixed relative to another that varies more rapidly. In general, adaptation schemes can be applied sequentially to attempt to choose this parameter at any time as this parameter may evolve. In this case, time-correlation is the trait that distinguishes one from another even though both may have a stochastic nature.

A multi-model adaptive Kalman filter 180 may be used to discern the best model 160. A set 160 of N assumed models 161, 162, 163 . . . are continuously tested to see if one emerges as a "better" model than the rest. This is a particularly good approach when only one unknown parameter really matters, such as chuck thermal contact. As each of N filters 181, 182, 183, . . . are run in parallel, each defines an optimal estimate for the same measurement sequence but using a different model 161, 162, 163, . . . . Usually the models 161, 162, 163, . . . are basically the same, and a single parameter is varied N times in some series of steps.

In the event that the response of the model 160 to the unknown parameter is continuous and not too severe, a limited number of models may be used in combination with a scheme that interpolates to determine a weighted combination of "best discrete models". Obviously, the more models needed (N) and the more parameters not known (M), the less efficient the process may be since a total of N×M models must be run.

Figure 3:
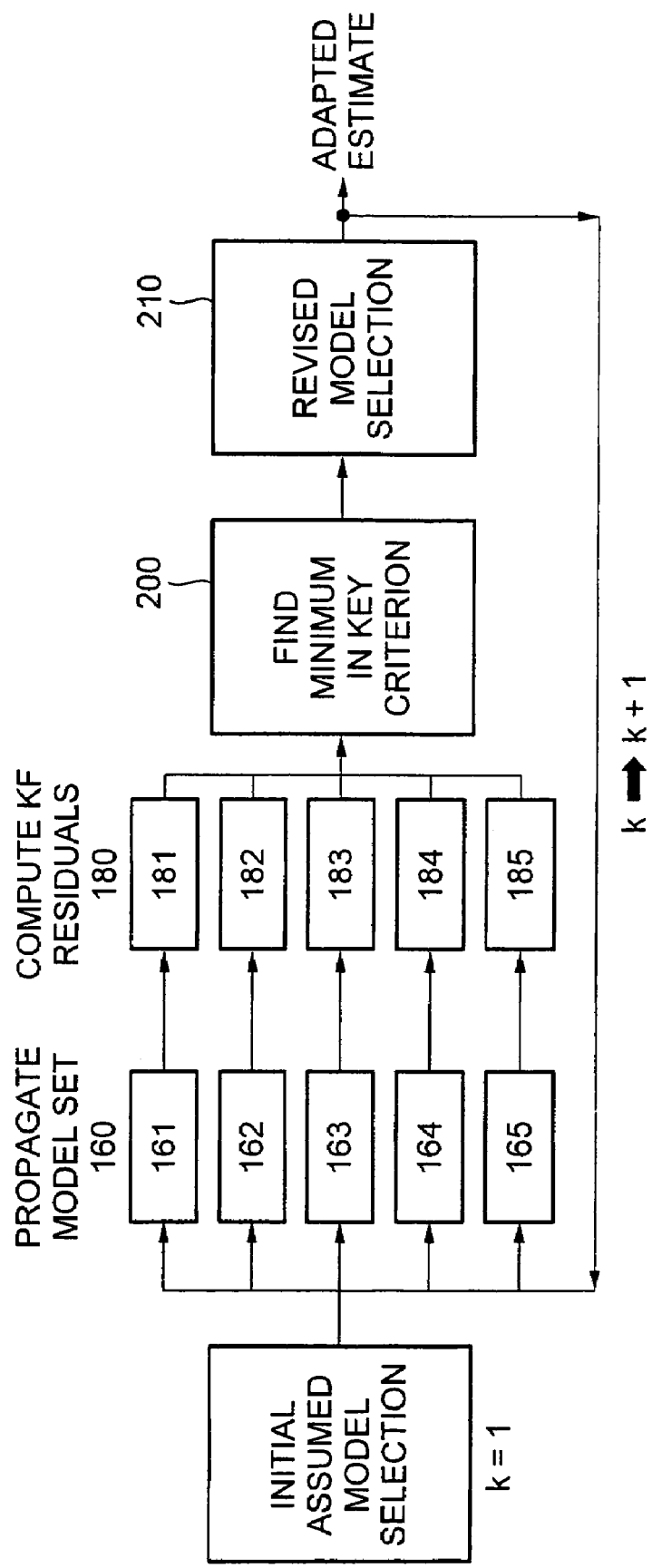
FIG. 3 illustrates a flow chart of an embodiment of steps of a multi-model adaptation carried out according to the principles of the present invention.

One issue is what criterion can be used to guide the "adaptation", which is the process of selecting the correct model or weighted combination of models in real-time. Publications exist on this topic, with various ideas depending on the nature of the problem. The common thread is analysis of the "residual", which is the historic record of differences between the estimate and the measurement. Therefore, in addition to the use of multiple filters 181, 182, 183, . . . , the other practical facet of a multi-model adaptation approach is a certain amount of historic book-keeping. The steps in multi-model adaptation are illustrated in FIG. 3. First, an initial model is selected, then several models and filters are run. A minimum is found for a key criterion at 200 and a revised model is selected at 210. The adapted estimate is output and looped back to the different model 161, 162, 163, . . . .

In the case of the SCALPEL responses, it may be reasonable to consider the unknown thermal contact parameter to be nearly fixed in the whole time-frame of one wafer exposure, then changed but fixed again for a second wafer exposure. For any one assumed parameter model, if the assumption is relatively bad the Kalman filter 180 behavior will be relatively bad, which will lead to a residual which is "large" in some key criterion. The prediction will diverge from reality and the filter will default to an estimate dominated by measurement (K~1), but directly limited by measurement noise and not much helped by the model 160.

Therefore, the model that reduces some criterion composed from the historic residual should be the "best model" and the Kalman filter 180 should transition from an initial assumption to the selection of this model. In general, this occurs gradually since the measurements are noisy, but a large enough amount of data will eventually establish a trend. Effectiveness in many real systems is based on the time-growth of the response associated with the uncertain parameter, such that tolerably little error accumulates in the time required to converge on the correct model. The specific length of the history considered and the specific criterion designed to make a selection depend on many factors, such as the duration one would expect the parameter to be nominally fixed, or the ultimate application where the best estimate is needed at a "singular end-event" time instead of all times.

Of course, the real state is not known for real situations, but should be known in a Monte-Carlo adaptive Kalman filter simulation, which is a common filter development method.

Adaptation criterion and model-selection methods are described below. A decision criterion is based on the history of residuals, where the residual is the vector difference between the measurement and the estimate for the whole state at each step, for each model acting in parallel. The momentary position error radius at each step is of interest in the SCALPEL problem. Therefore, the position error radius can be formed from appropriate residual components at each step, and a simple average error radius over some history length can be calculated for each model 161, 162, 163 . . . . This average could consider a length of time either shorter than or up to the total time of the system propagation or the full length of the history at each step. This average error radius is the best criterion for adaptation in the SCALPEL case.

In running an adaptative Kalman filter, the average error radius is calculated for each model number at each time step. As the system propagates, a clear minimum inside the assumed model range occurs, and this almost always corresponds to the selection of the correct model used to generate a truth simulation, unless the state noise effects are overwhelmingly large.

The plot is a visual representation of the data that is analyzed at every step to form an adaptation scheme. The correct or "best" model occurs at the model number having the lowest residual radius error over some characteristic averaging time. Essentially, the strength of the minimum within the available model set is used as the selection criterion. The minimum should be both pronounced and sustained. Simulations or trials can be used to determine if the range of models assumed is appropriate to make sure that a minimum can eventually be found.

Analysis of the position and strength of this minimum is aided by using a normalized contrast criterion ranging from 0 to 1 to compare the maximum and minimum values of this residual radius error across the model set as a function of time contrast($k$)=[Max−Min]/[Max+Min]@step $k$ where Max and Min refer to the averaged error radius of each model.

Figure 4A:
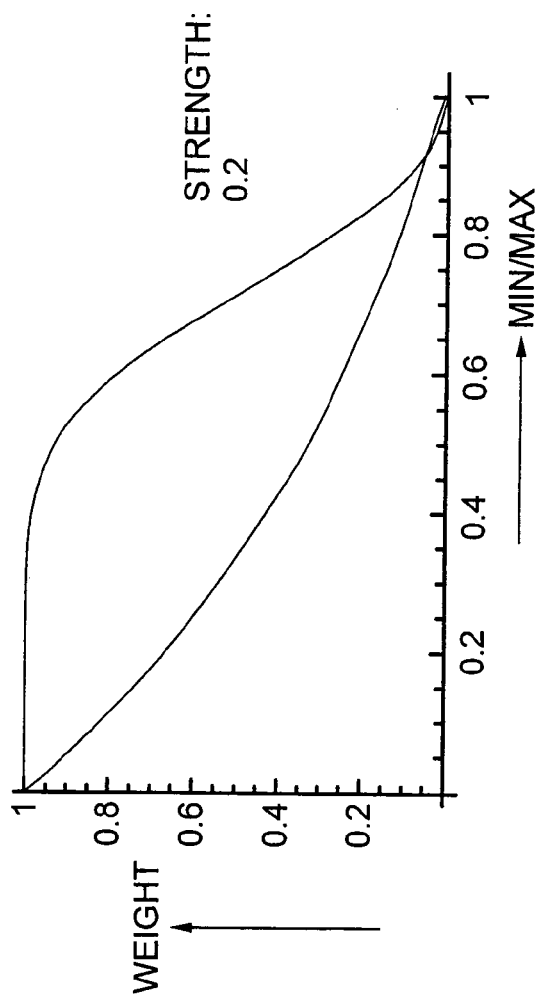
FIGS. 4a and 4b illustrate graphs that represent an embodiment of a weight-determining function carried out according to the principles of the present invention.
Figure 4B:
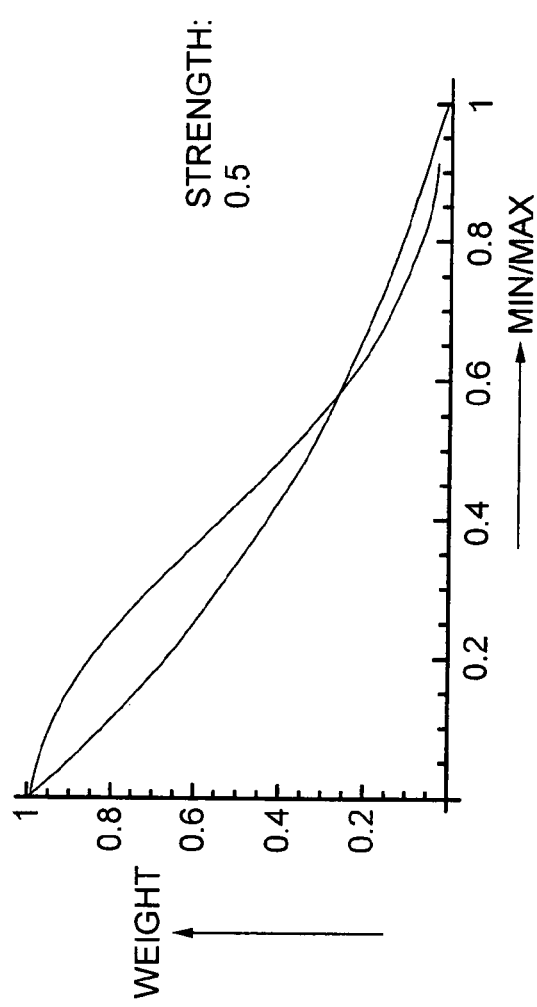

To translate these fairly small contrast values into a criterion for selecting a given model, it may be useful to use a second weight-determining function. The second weight-determining function should be a smooth function that translates this basic contrast evaluation in a simple way, over a normalized range of 0 to 1. The specific function chosen is not important as long as tuning of the parameters is done in simulations. FIGS. 4a and 4b illustrate a function (Adapt-weight=1−Exp[−(contrast/strength)^2].) that can be made to saturate the weight versus contrast relationship depending on a single strength parameter (with examples shown for strength=0.2 and 0.5).

Therefore, the process of developing an adaptive filter entails tuning the strength parameter to determine the weighting of adaptation. This weight can be considered to be similar to an "outside loop" version of the Kalman gain (K) that goes from 0 to 1 as the measurement data provides enough information to select a best model. A distinction is that this weight operates on a whole history of residual data from action of the set of filters, while the K in each filter operates only one step at a time and within its own assumptions.

Although the present invention has been described above as the implementation of a Kalman filter 18 or a multi-model adaptive Kalman filter 180 in a projection electron lithography method or apparatus, other additions or refinements may be possible including:

using the weight to interpolate between discrete models and allow selection of a best model that combines two near-minimal residual models;

using a "no-turning-back" scheme where the weight is not allowed to go back down in the unusual event that a longer history of measurements does not continue to converge on a stronger minimum residual (this option makes sense if there must be a singular fixed model and state noise is relatively small, but tuning can become complex if state noise is large, namely the measurements must counter both noise and parameter uncertainty problems);

replacing the starting-assumption model at some threshold weight value with the last adapted model;

smoothing of the adaptation process, which may yield a smoother result but not necessarily a better one, and is subject to tuning.

FIGS. 5a and 5b illustrate the response of a nominally tuned adaptation scheme based on averaged error radius curves and multi-model execution. Note that in FIG. 5b, the starting assumption is model #6, but the truth model is model #4, both of which lie inside a range from a low at #1 to a high at #9. The weight of adaptation in FIG. 5a rises sharply at about ¼ the time into the sequence and is locked at its last high value. The model selection oscillates slightly after the assumed model is rejected, and then it converges close to the true model. In a preferred embodiment, more than three models are used, and in a more preferred embodiment, five models are used.

The SCALPEL wafer-heating response requires a complex heat transfer and elastic strain model based on partial differential equations and boundary conditions, with mixed cylindrical and Cartesian coordinate systems used for key features. The response cannot be simplified by treating only certain dominant modes of the response. The response can be almost arbitrarily complex and variable with several parameters. The dynamic distortion process should be corrected to a few nanometers accuracy at times corresponding to unique sub-field locations throughout the exposure, corresponding to roughly one million model steps in about 2 minutes, or a step rate of 8333 Hz. In each step, a full history-dependent snapshot of an extended system model would have to be executed. The likelihood of obtaining even one adequately fast and accurate real-time model is poor, and running an array of models for adaptation may be impractical.

However, the Kalman filtering described above is an inherently numerical approach to propagating system state estimates based on differential equations. The Kalman filtering described above is also inherently linear in the way it incrementally adds a new prediction to the prior estimation of the state using a predictive model. Therefore, it is natural to substitute a sequence of numbers in the matrix positions for what would otherwise be a discretely propagated function-based model. If the numbers exist a-priori, the linear matrix algebra can be very fast because the differential equations have been effectively solved before-hand.

A remaining issue is the speed of the a-priori number generation processor. Since this process is not done in real-time during the one or two minute exposure time, presumably much more time could be taken. However, throughput requirements on the exposure tool require that such a calculation does not add significant time to the batch process time of many wafers, for example 30 wafers exposed in an hour. The up front calculations have to be some combination of fast and/or done in parallel to other necessary lithography tool functions.

Since high throughput is usually associated with repetitive exposure batches, the up-front model variations should be limited to occasions when the pattern (mask) is changed or significant conditions (exposure current or resist dose) might change. If at least 25 wafers are run with the expectation of completing them in about an hour, spending one minute overall on computation is acceptable but spending 25 minutes in repetitive computation is not.

As stated earlier, the main distinction of each wafer exposure in a batch is likely to be chuck thermal contact and beam drift. However, due to the linearity in the combination of basic elements of the Kalman filter 18, there is nothing about the operation of the Kalman filter 18 that would "feed back" a required change to the basis predictive model. They are uncoupled, and it is well known that many elements of a Kalman filter 18 can be pre-computed and stored to minimize the real-time computation burden. This is also true for adaptive Kalman filtering 180 as well, assuming that a whole array of models exists for the full time. In fact, this may be a reason to implement the multi-model adaptation scheme, instead of a scheme that minimizes the number of models used as the unknown parameter is discerned.

If number sequences are chosen for the model, the predictive model and Kalman filter can be decoupled entirely to allow any good model technique to be used for any up-front calculation. A remaining issue in implementing the Kalman filter is deciding what position the model-result sequence should take in the Kalman filter equations. It is tempting to just substitute the number sequence for the whole predictive step to give X(k+1/k), but this is incorrect. The general reason why it is incorrect is because the Φ component of the state space predictor also propagates the state error covariance that makes the filter work. Therefore these substitutions must be consistent and careful.

For SCALPEL wafer heating and beam drift response, the nature of the system actually simplifies the model integration problem. The "model" of beam drift propagation may only require the state-noise band-limit filter function. This is consistent with the idea that the electron beam is a system with negligible inertia. Further, drift noise is instantly and fully added to the position state, and the modified state has no effect on incremental propagation to the next state.

Therefore, given the fact that the $\Phi$ matrix is augmented with this filter function already, the simplest answer is to use a "null" basis state propagation model with the pre-calculation treated as "input", given by:

$$\Phi = 0$$

$$U = [X_u, 0, y_u, 0]^T$$

The x and y entries in U are a sequence of pre-calculated predicted sub-field center responses at known times. The use of a state vector comprised of position and velocity is continued.

This approach has been shown to work adequately by simulation. However, other methods are possible. For example, it may be possible to propagate the state noise covariance with a simple, approximate model that has some basic physical sensibility.

As described above, the present invention is directed to a method and apparatus that implements a Kalman filter 18 or an adaptive Kalman filter 180 correction scheme for wafer heating and beam drift in projection electron beam lithography, such as SCALPEL. The Kalman filter is based on a numerical response model interface that allows efficient integration of relatively slow but infrequent pre-calculation results, and allows real-time adaptive Kalman filter functionality. The present invention demonstrates the feasibility of a die-center correction for the critical "global" part of the correction scheme. The local part can be done by pure prediction since the errors are smaller and less subject to effects of drift and chuck contact uncertainty.

The adaptive Kalman filter 180 behavior is very good for a scenario that is realistic or somewhat pessimistic in key parameters, including a slow beam drift of typically 40 nm and a 15 nm 3-sigma one-site alignment noise. Adaptation in a multi-model form is effective at handling the problem of at least a factor of two thermal contact parameter uncertainty, in a scenario where the contact is a great deal lower than what we know is possible, hence giving relatively large responses. Combined errors on the order of 50 nm in predicting responses that are well over 100 nm can be reduced to 10 nm or better. With some optimization of the corrector and the benefit of maximum chuck thermal contact, it is likely that error budget requirements of nominally 5 nm will be met.

Although the various embodiments of the Kalman filter described above may be used to correct for wafer heating, beam drift and/or other errors in a SCALPEL or other projection electron beam lithography system, the present invention is not limited to correction of these errors. Other correctable errors may include errors related to the current at the wafer, the thickness of the wafer, thermal response parameters (which may include heat capacity, heat conductivity, thermal expansion coefficient, Young's modulus, or Poisson's ratio of Si), wafer-to-chuck frictional contact, wafer-to-chuck thermal contact, wafer initial temperature profile, and/or beam drift (which may be related to charging, stray fields, electronics, and/or thermal factors).

It is noted that the functional blocks in FIGS. 1-3 representing the Kalman filter 18, 180 and model 16, 160 may be implemented in hardware and/or software. The hardware/software implementations may include a combination of processor(s) and article(s) of manufacture. The article(s) of manufacture may further include storage media and executable computer program(s). The executable computer program(s) may include the instructions to perform the described operations. The computer executable program(s) may also be provided as part of externally supplied propagated signal(s).

In an exemplary implementation of the numerical integration approach described above, the real-time operation of a die-by-die Kalman filter, using pre-existing numerical model results, only took 14 seconds to run on a 400 MHz PC running noncompiled and relatively-slow Mathematical® 3.0 by Wolfram Research Inc., of Champaign, Ill., with many extra plotting and data output steps. This is easily fast enough for real-time use if die exposures take at least 1 second. This result is expected because the recursive part of the Kalman filter is mainly linear matrix algebra. Equivalent compiled code runs should be much faster for real tool implementation. Other control system development and simulation software, such as MatLab®, by the MathWorks Inc., of Natick, Mass., could also be used, as could any of the C-family of languages.

Although the estimator described above is a Kalman filter, any number of other estimators such as simple observers, full order observers, reduced order observers, trackers, or other estimation techniques known to one of ordinary skill in the art or combinations thereof, are also contemplated by the present application. Still further, although the statistical technique utilized above is a least squares technique, other techniques, such as variance, (linear or not), general optimal, maximum likelihood, maximum a-posteriori, weighted leased squares, or other techniques known to one of ordinary skill in the art or combinations thereof, are also contemplated by the present application.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A projection electron lithography system, comprising:
   a lithography tool for emitting a beam of electrons and producing measurement information; and
   a processor including,
      a plurality of different predictive models for producing predictive information, and
      an adaptive estimator that iteratively selects a predictive model having a minimum criterion from said plurality of different predictive models and controls placement of said beam of electrons based on said predictive information from said selected predictive model and said measurement information from said lithography tool, said adaptive estimator employing a tunable strength parameter to determine an optimal adaptation weighting criterion.

2. The system of claim 1, wherein said minimum criterion is based on a historic residual associated with said plurality of different predictive models.

3. The system of claim 2, wherein said minimum criterion is an average error radius associated with each of said plurality of different predictive models.

4. The system of claim 1, wherein said adaptive estimator compensates for heating and beam drift effects.

5. The system of claim 1, wherein said adaptive estimator employs least-squares based linear matrix algebra.

6. The system of claim 1, wherein said system is a SCALPEL system.

7. The system of claim 1, wherein said adaptive estimator is an adaptive Kalman filter.

8. The system of claim 1, wherein said adaptive estimator is an adaptive Kalman filter and each of said plurality of different predictive models is partitioned into wafer scale components and die scale components, said adaptive Kalman filter only employed for wafer scale components.

9. The system of claim 1, wherein said plurality of different predictive models differ due to a single parameter that varies in each of said plurality of different predictive models.

10. The system of claim 1, wherein said plurality of different predictive models includes three or more models.

11. The system of claim 1 wherein said plurality of different predictive models are only directed to producing said predictive information for corrections associated with a die scale.

12. A computer implemented process for controlling projection electron lithography, comprising:
   emitting a beam of electrons;
   producing measurement information on said emitting step;
   producing predictive information related to the projection electron lithography process based on a plurality of different predictive models;
   iteratively selecting one of said plurality of different predictive models until a predictive model having a minimum criterion from said plurality of different predictive models emerges; and
   controlling placement of the beam of electrons based on selected predictive information from said predictive model and said measurement information, wherein said controlling includes determining an optimal adaptation weighting criterion employing a tunable strength parameter.

13. The process of claim 12, wherein said minimum criterion is an average error radius associated with each of said plurality of different predictive models.

14. The process of claim 12, wherein said controlling step employs an adaptive Kalman filter.

15. The process of claim 12, wherein said controlling step compensates for heating and beam drift effects.

16. The process of claim 12, wherein said process is a SCALPEL process.

17. The process of claim 12, wherein said controlling step is implemented as an adaptive Kalman filter and each of said plurality of different predictive models is partitioned into wafer scale components and die scale components, said adaptive Kalman filter only employed for wafer scale components.

18. The process of claim 12, wherein said plurality of different predictive models differ due to a single parameter that varies in each of said plurality of different predictive models.

* * * * *